(12) United States Patent
Held et al.

(10) Patent No.: US 8,797,048 B2
(45) Date of Patent: Aug. 5, 2014

(54) CAPACITIVE ROTATION SENSOR

(75) Inventors: Siegfried Held, Donaueschingen (DE); Johann Buecher, Aldingen (DE); Andreas Woehrstein, Koenigsfeld (DE)

(73) Assignee: Hengstler GmbH, Aldingen (DE)

( * ) Notice: Subject to any disclaimer, the term of this patent is extended or adjusted under 35 U.S.C. 154(b) by 574 days.

(21) Appl. No.: 12/769,039

(22) Filed: Apr. 28, 2010

(65) Prior Publication Data

US 2010/0271050 A1    Oct. 28, 2010

(30) Foreign Application Priority Data

Apr. 28, 2009   (DE) .......................... 10 2009 019 172

(51) Int. Cl.
*G01R 27/26*   (2006.01)
*G01R 27/02*   (2006.01)

(52) U.S. Cl.
CPC ................ *G01R 27/26* (2013.01); *G01R 27/02* (2013.01); *G01R 27/2605* (2013.01)
USPC ........... 324/662; 324/658; 324/667; 324/661; 340/870.34; 340/870.35; 340/870.37

(58) Field of Classification Search
CPC .... G01R 27/00; G01R 27/02; G01R 27/2605; G01R 27/26
USPC ............. 324/662, 658, 667, 661; 340/870.34, 340/870.35, 870.37
See application file for complete search history.

(56) References Cited

U.S. PATENT DOCUMENTS

| | | | |
|---|---|---|---|
| 2,671,892 A * | 3/1954 | Childs ...................... | 340/870.35 |
| 3,668,672 A | 6/1972 | Parnell | |
| 3,694,041 A * | 9/1972 | Studer ......................... | 310/90.5 |
| 4,737,699 A * | 4/1988 | Wen .............................. | 318/662 |
| 4,851,835 A * | 7/1989 | Krumholz et al. ....... | 340/870.37 |
| 4,862,752 A * | 9/1989 | Hoyt ........................ | 73/862.326 |
| 4,963,829 A * | 10/1990 | Wereb ............................ | 324/660 |
| 4,998,103 A * | 3/1991 | Rosswurm et al. ...... | 340/870.37 |
| 5,040,996 A * | 8/1991 | Kobold et al. ............... | 439/76.2 |

(Continued)

FOREIGN PATENT DOCUMENTS

| | | |
|---|---|---|
| EP | 1173730 B1 | 1/2002 |
| EP | 1251338 A1 | 10/2002 |
| EP | 2270433 A2 | 1/2011 |

OTHER PUBLICATIONS

European Search Report of corresponding European Patent Appln. No. EP2246669A3 dated Oct. 18, 2013.

*Primary Examiner* — Patrick Assouad
*Assistant Examiner* — Lamarr Brown
(74) *Attorney, Agent, or Firm* — Browdy and Neimark, PLLC

(57) ABSTRACT

A capacitive rotation sensor for detecting the position of an object moving relative to a stationary object, comprising a shaft rotatably supported in a housing flange, said shaft being connected integral in rotation therewith to a rotor to which, separated by an air gap, a stator situated opposite thereto is assigned, wherein at least the rotor, the stator and an evaluation circuit are enclosed by an electrically conductive cap, wherein a stator surface is arranged on the underside of a circuit board and the stator surface has assigned thereto, situated opposite thereto and separated by the air gap, a non-rotation-symmetrical rotor disc which, in turn, is fixed on a rotor support, said rotor support being fastened highly precisely on the outer periphery of the shaft so as to be integral in rotation therewith.

22 Claims, 7 Drawing Sheets

(56) References Cited

U.S. PATENT DOCUMENTS

| | | | | |
|---|---|---|---|---|
| 5,099,386 A | * | 3/1992 | Stokes et al. | 361/298.5 |
| 5,537,109 A | * | 7/1996 | Dowd | 340/870.37 |
| 5,872,408 A | * | 2/1999 | Rakov | 310/68 B |
| 6,304,163 B1 | * | 10/2001 | Rippingale | 335/303 |
| 6,492,911 B1 | * | 12/2002 | Netzer | 340/870.37 |
| 7,078,915 B1 | * | 7/2006 | Lin | 324/660 |
| 2004/0046548 A1 | * | 3/2004 | Pettersson et al. | 324/207.17 |
| 2004/0085079 A1 | * | 5/2004 | Lin et al. | 324/662 |
| 2005/0088184 A1 | * | 4/2005 | Burdick et al. | 324/658 |
| 2008/0278217 A1 | * | 11/2008 | Hankhofer et al. | 327/509 |
| 2010/0225333 A1 | * | 9/2010 | Uchida et al. | 324/658 |

* cited by examiner

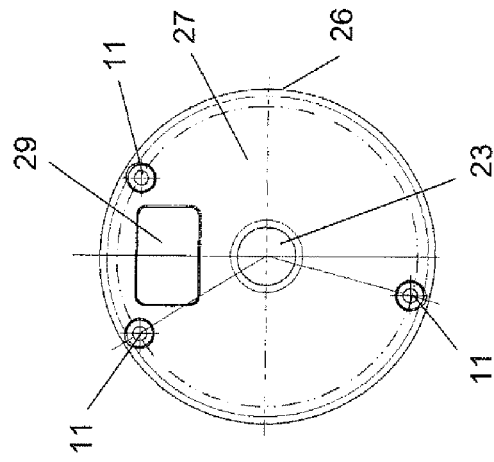
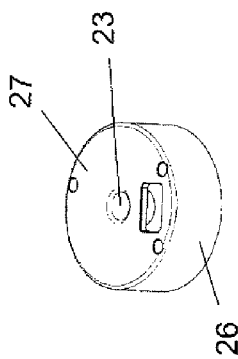
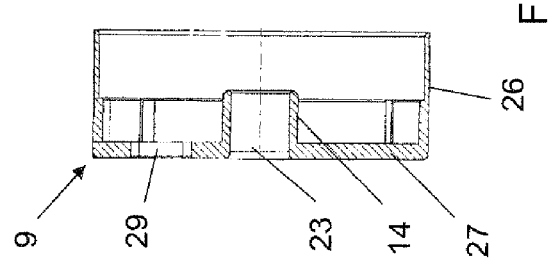
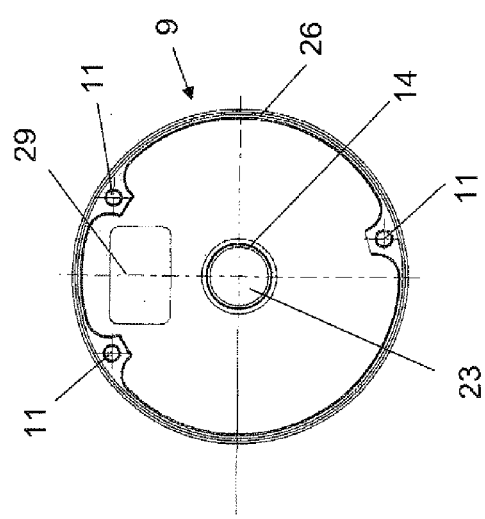
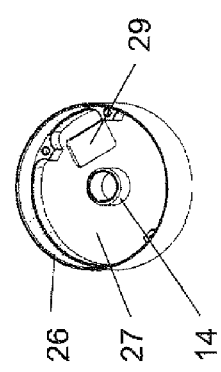

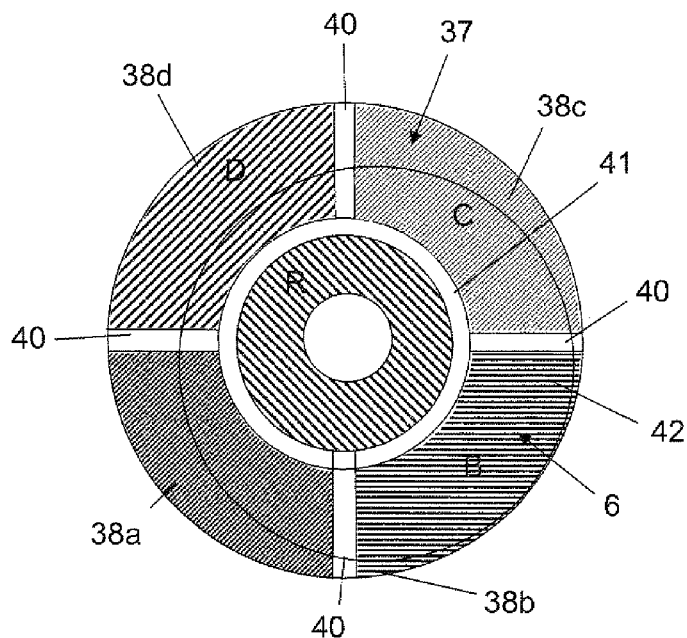
Fig. 12
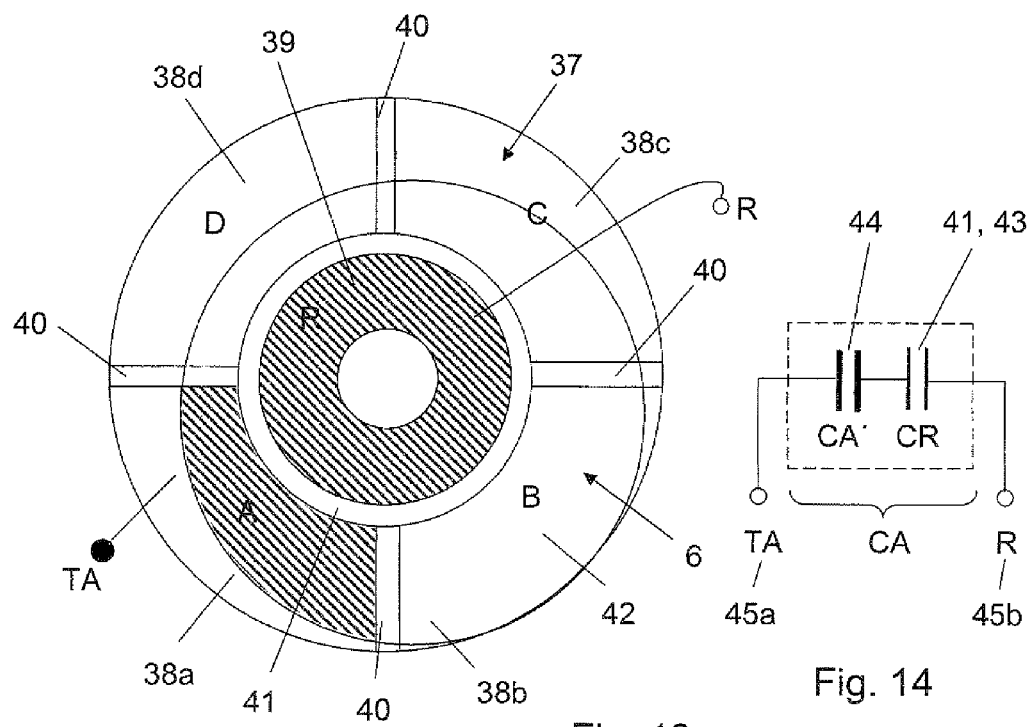
Fig. 13
Fig. 14

CAPACITIVE ROTATION SENSOR

The present invention relates to a capacitive rotation sensor for detecting the position of an object moving relative to a stationary object. Such a capacitive rotation sensor has become known, for example, with the subject matter of EP 1 173 730 B1 (DE 600 16 395 T2). This rotation sensor has the shortcoming, however, that it is relatively complex and expensive to produce, because it is required in this arrangement that an outer rotor shaft is pressed onto an inner vertical flange of a rotor disc using only a press fit in order to thus mechanically assemble the rotation sensor.

This design, however, has the shortcoming that when a press fit is provided between a vertical flange of the rotor disc and the outer periphery of the rotor shaft a certain unbalance or runout (wobble) exists at the rotor disc that can be corrected only with difficulty by means of an electric evaluation circuit.

Moreover, this known arrangement has the shortcoming that there is no hood enclosing the entire arrangement, more particularly a type of hood that has a pivot bearing for the rotor shaft so as to guide the rotor shaft as precisely and centrically as possible and without runout.

Since an integral bearing of the rotor shaft is absent in this known rotation sensor, potential radial deviations or runouts that are transferred from a driving motor to the rotor shaft are transferred directly via the circular press fit to the rotor disc, thereby contributing further to the runout.

Consequently, the system according to the prior art is relatively complex in its design and imprecise in the evaluation of a rotation angle.

The aim of the invention is to improve a rotation sensor of the type mentioned at the beginning in such a way that greater accuracy is achieved in terms of the electrical resolution of the measuring result at greatly reduced production costs.

Furthermore, the invention has the secondary aim to implement a rotation sensor that is as cost-effective as possible and has a high degree of accuracy.

In order to achieve this aim a capacitive rotation sensor is provided for detecting the position of an object moving relative to a stationary object, comprising a shaft rotatably supported in a housing flange, the shaft being connected integral in rotation therewith to a rotor to which, separated by an air gap, a stator situated opposite thereto is assigned, wherein at least the rotor, the stator and an evaluation circuit are enclosed by an electrically conductive cap, wherein a stator surface is arranged on the underside of a circuit board and that the stator surface has assigned thereto, situated opposite thereto and separated by the air gap, a non-rotation-symmetrical rotor disc which, in turn, is fixed on a rotor support, the rotor support being fastened highly precisely on the outer periphery of the shaft so as to be integral in rotation therewith.

It is an essential feature of the invention that the electronic evaluation circuit is arranged on a printed circuit board, directly on the underside of which a stator surface is arranged in an electrically conductive manner, and that a non-rotation-symmetrical rotor disc is assigned to the stator surface, situated across from same and separated by an air gap, said rotor disc in turn being fixed in a rotor support, the rotor support being fastened highly precisely in a form-fitting manner on the outer periphery of the rotor shaft.

With the present technical teaching the significant advantage is attained that a high degree of accuracy of the measuring result is achieved with a simple design.

The simple design is achieved in that the printed circuit board that carries the electronic evaluation circuit and among other things also the circuit for error correction, at the same time also carries on its underside the electrically conductive stator surface, which is preferably designed in the form of a copper conductor path coated with an insulating lacquer.

Consequently the circuit board attains a dual function, namely on one hand that of a support for the detection-, evaluation- and error correcting circuits and at the same time that of a support for the stator surface that is provided in the form of an electrically conductive copper surface on the underside of the circuit board and coated with an insulating lacquer.

In order to attain a highly precise arrangement that is protected against unbalance, provision is additionally made that the opposed rotor disc that is separated by the air gap likewise consists only of a copper surface arranged on a rotor support, the rotor support preferably being designed to consist of an electrically insulating plastic material.

The rotor support thus is a simple cost-effective plastic part which is fitted highly precisely and in a form-fitting manner on the outer periphery of the shaft, and a recess that is open on one side is arranged on the rotor support, into which recess the rotor disc is inserted that, viewed over the direction of rotation, is designed eccentric.

This results in a particularly simple and cost effective design which, additionally, is also highly precise.

By fixing the rotor disc consisting of a thin copper material in a recess of the rotor support, the recess being open on one side, a particularly simple production is attained.

Fixing such a simple copper disc in a recess of the rotor support formed of plastic can take place, e.g. by means of gluing using an adhesive, or by inserting an adhesive ring that is designed to be adhesive on both sides and is adhesively fixed with its bottom surface in the recess of the rotor support and with its upper adhesive surface enters into an adhesive bond with the underside of the rotor disc.

Of course, the invention is not limited to the eccentrically designed rotor disc consisting of a cost-effective copper material. In another embodiment provision can be made that the rotor disc consists of aluminum or steel, which again is inserted in the above-described manner into a recess of the rotor support and fixed there preferably by means of an adhesive or adhesive disc.

With the present technical teaching the advantage arises that, due to the highly precise mounting of the rotor support on the outer periphery of the shaft, a deformation or running out of the rotor disc is prevented because a press fit in the sense of the prior art (see above description) is avoided. Instead, according to the invention different embodiments are provided whereby a specific unstressed mounting of the rotor support on the outer periphery of the shaft can be accomplished:

1. In a first embodiment provision is made that a dentition is provided on the outer periphery of the shaft, and the rotor support likewise has a dentition on the inner periphery thereof, such that a form-fitting, rotationally integral connection exists between the rotor support and the outer periphery of the shaft, without there being a press fit that would result in an unbalance.

2. In a second embodiment provision is made that the rotor support consists of a suitable plastic material and is injection-molded directly onto the outer periphery of the metal shaft, in order to thus achieve an unstressed form-fitting connection to the outer periphery of the shaft.

Another essential feature for achieving a highly precise support of the circuit board that, at the same time, carries the stator, is that provision is made according to the invention that the circuit board is arranged by means of a flange in the cap covering the entire rotation sensor and the cap, in turn, is supported on a housing flange, the housing flange being centered via a pivot bearing arrangement on the shaft.

In this manner a highly precise dimension transfer is achieved in such a way that, to begin with, preferably two ball bearings that are biased relative to one another and carry the housing flange are provided on the outer periphery of the shaft. This ensures that the housing flange is supported well-centered on the outer periphery of the shaft 3 with as little friction as possible and runout-free.

According to the invention provision is now made that the outer periphery of the housing flange serves as a centering surface for the inner periphery of the cap placed thereupon and that this cap transfers this centric dimension to an axially inwardly situated annular flange (tubular centering spigot) at the lower front face of which a bevel is provided against which the inner front face of the printed circuit board fits highly precisely with the aid of a mating surface in order to thus be centered highly precisely in the housing.

In this manner the dimension of the outer periphery of the shaft is highly precisely transferred via the aforementioned ball bearings via the housing flange and transferred from the outer periphery of the housing flange via the highly precisely manufactured cap to the inner periphery of the centric annular flange (centering spigot) of the cap, at the inner periphery of which, in turn, the radially inwardly located front face of the printed circuit board is centered.

In a modified embodiment provision is made that in lieu of the internal centering of the circuit board an external centering is provided. In this case the outer periphery of the circuit board fits centrically and highly precisely against the inner periphery of the housing flange or cap.

This ensures that the stator provided on the underside of the circuit board is centered highly precisely in the housing.

In a further improvement of the present invention provision is made that this system that is centered within itself and supported within itself is provided with a highly precise air gap formed between the rotor and the stator.

Namely, this air gap is achieved simply by trueing (turning machining) of the rotor disc. A milling or grinding process can be used as well.

A potential radial runout that could arise during assembly is prevented in that the rotor is trued once more after it has been installed in order to thus attain an air gap that extends evenly about the entire radius, which therefore is formed completely uniform parallel over the radial extension thereof relative to the opposed stator.

It is particularly advantageous when the eccentric rotor disc that is inserted in the rotor support protrudes slightly beyond the thickness of the rotor support, in order to then be able to true this protruding surface precisely centrically so as to attain an air gap that extends parallel over the radial distance from the inside to the outside.

If contrary to all expectations a residual error should remain, same is compensated for according to the invention by means of an electronic circuit arranged on the printed circuit board providing the appropriate error correction.

The subject matter of the present invention is derived not only from the subject of the individual claims but also from the combination of the individual claims among each other.

All information and features disclosed herein, including in the abstract, in particular the dimensional embodiments shown in the drawings, are claimed as essential to the invention to the extent that they are novel over the prior art, either individually or in combination.

In the following the invention will be explained in conjunction with drawings depicting one possible embodiment.

Additional features and advantages of the invention will become apparent from the drawings and their description.

In the drawings,

FIG. 1 shows, schematically, a center longitudinal section through a capacitive rotation sensor FIG. 2 shows a top view of the rotation sensor according to FIG. 1 with the cap removed FIG. 3 shows a section through the cap FIG. 4 shows an interior view of the cap FIG. 5 shows an exterior view of the cap FIG. 6 shows, perspectively, an interior view of the cap FIG. 7 shows, perspectively, an exterior view of the cap FIG. 8 shows, perspectively, a front elevation of the rotor support FIG. 9 shows an enlarged sectional view through the rotor support in the region of the center bore FIG. 10 shows a section through the rotor support according to FIG. 8

FIG. 12 shows, perspectively, the covering of the stator surface by the eccentric rotor surface FIG. 13 shows the same view as FIG. 12 with additional details FIG. 14 shows the circuit analogy resulting from the arrangement according to FIGS. 12 and 13

Figures 1, 2:
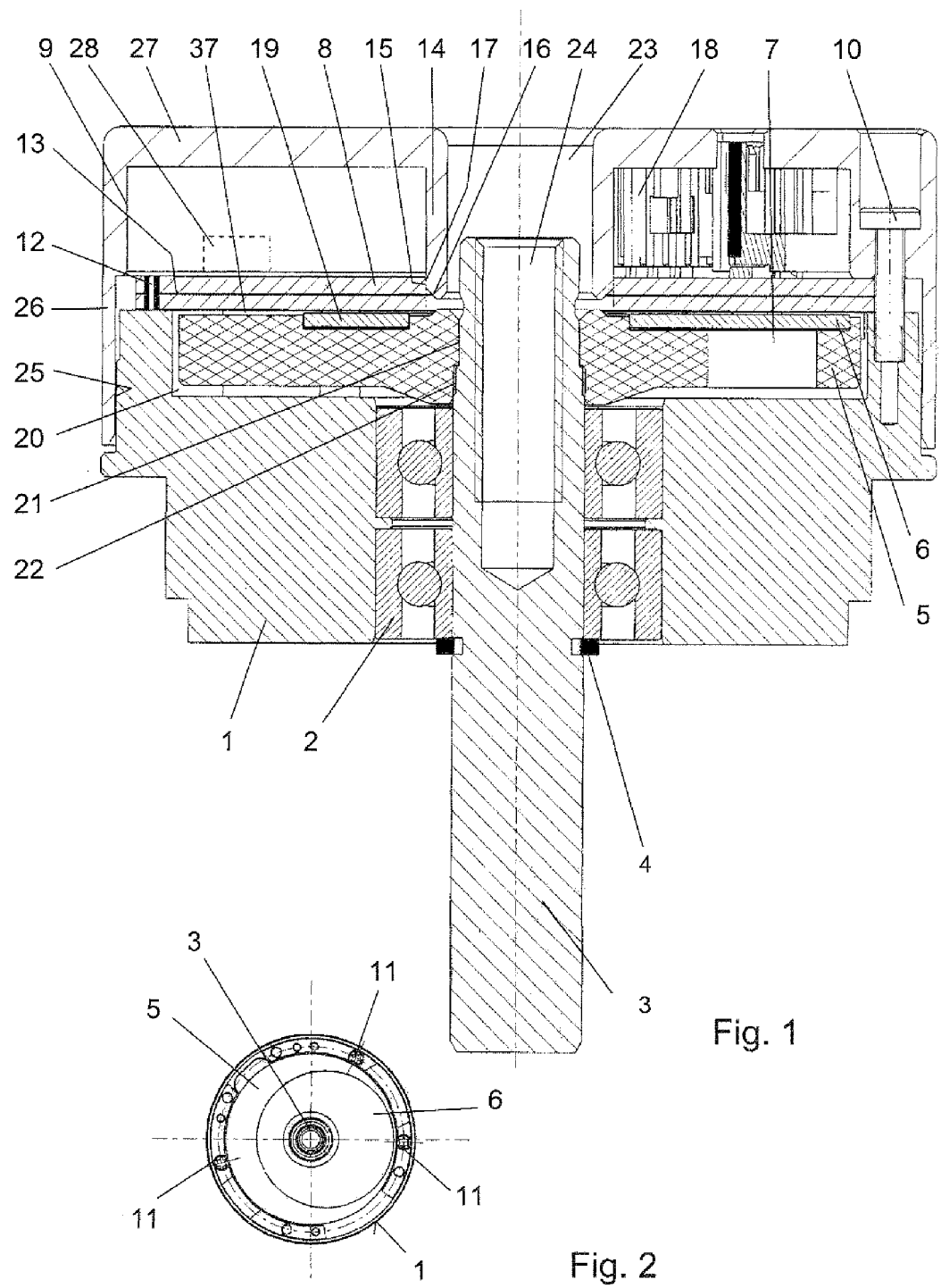
Figure 20:
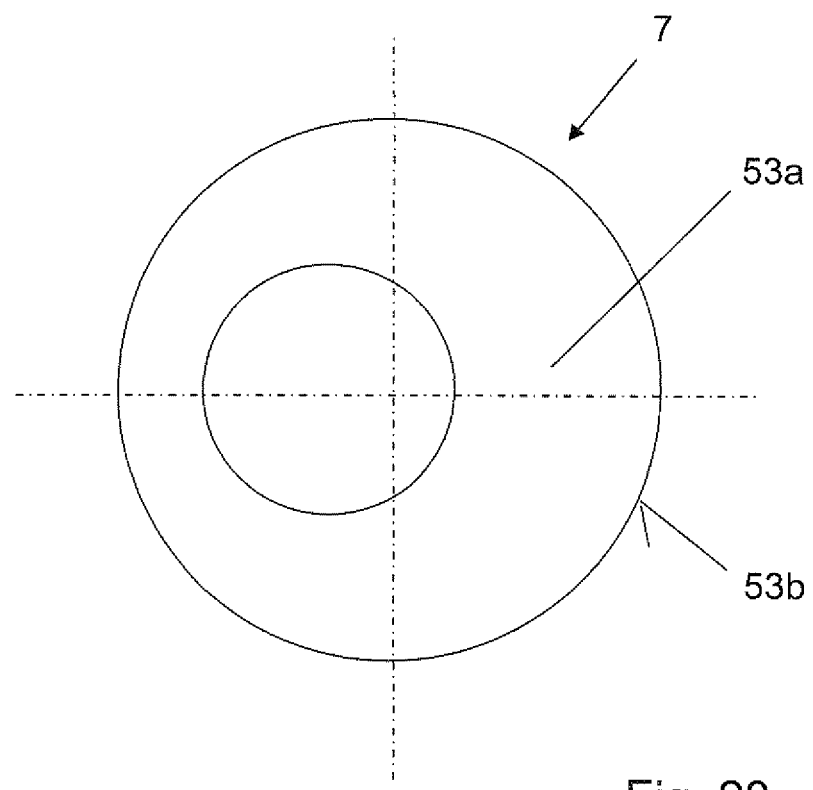
Figure 21:
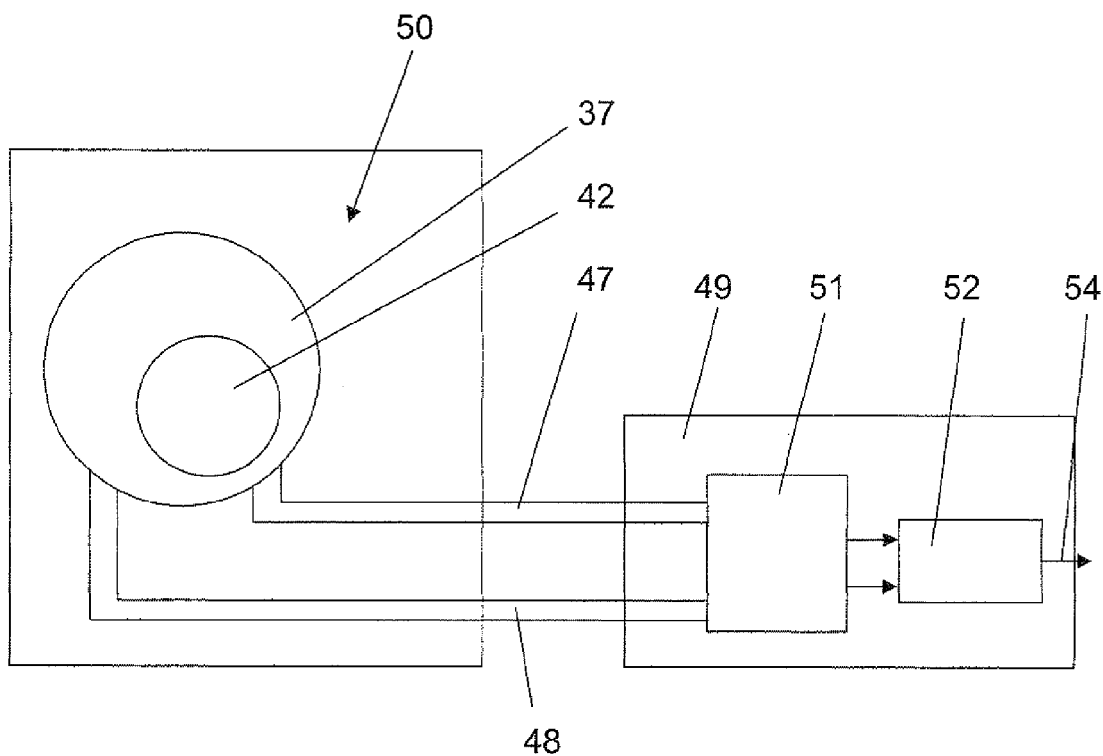

FIG. 20 shows the top view of the adhesive ring that fixes the rotor disc in the rotor support FIG. 21 shows, schematically, a circuit for operation of the capacitive sensor FIGS. 1 and 2 illustrate that the capacitive rotation sensor according to the invention substantially comprises a housing flange 1 consisting e.g. of cast aluminum which is designed cylindrical and in the interior bore of which a configuration of ball bearings 2 is provided that are biased relative to one another.

The ball bearings 2 are preferably designed in the form of groove ball bearings. In another embodiment provision can be made that these ball bearings are designed as sliding bearings or generally as roller bearings.

In the interior a shaft 3 is received by the ball bearings 2, said shaft 3 extending with a lower elongated portion out from the housing of the capacitive rotation sensor and being secured with the aid of a clamping ring 4 against falling out. This clamping ring 4 can also be eliminated. However, it serves to provide for additional absorption of axial forces that are transmitted from the shaft 3 to the housing flange 1.

In a manner to be described in more detail later, a rotor support 5 which preferably consists of plastic is arranged highly precisely on the outer periphery with the aid of a knurled mating surface 21 on the outer periphery of the shaft 3 in a form-closed and rotationally integral manner. It is important in this context that the knurled mating surface 21 permits the rotor support 5 to be fastened on the outer periphery of the shaft 3 integral in rotation therewith and unstressed. In lieu of the knurled mating surface 5 [sic] a square, double-edged or polygonal connection can be provided as well.

Furthermore, it is important that the rotor support 5 has on its upper side a depression 30 (see FIGS. 8 to 11) in which a double-sided adhesive ring 7 is inserted that adheres with one of its adhesive surfaces to the bottom of the depression 30 and with its opposite adhesive surface fixes the rotor disc 6 which is designed as a narrow metal surface.

In this manner a simple, highly precise fixing of the rotor disc 6 is provided, especially when—as described in the general part—the rotor disc 6 after installing same on the rotor support and after installing the rotor support on the shaft, is also trued afterwards.

Furthermore, it is important that across from an air gap 19 across from the rotor disc 6 a stator surface 37 is provided that is designed in the form of a thin conductor path surface, in a thickness (e.g. 30 to 100 micrometers) such as that used in conventional printed circuits. This results in a very simple production of the stator surface 37 because same is arranged in the style of a metallized copper conductor surface on the surface of a printed circuit board 8.

This circuit board 8 accordingly forms on the underside the stator and carries on the upper side an electronic circuit 28 in which the evaluation circuit and the error correction circuit are arranged.

Furthermore the circuit board 8 carries the electrical connection 18 which is designed, e.g. in the form of a connector and accessible from outside through a cut-out 29 arranged in the cap.

The cap 9 is formed highly precisely e.g. of an aluminum die casting and designed electrically conductive.

It is composed of an outer vertical flange 26 that fits in the form of an annular flange evenly against the outer periphery of the housing flange 1 in the region of a mating surface 25, and this fit is transferred via the vertical flange 26 to the horizontal flange 27 of the cap 9 and from there to a further annular flange 14 of the cap serving to provide the inner centering of the circuit board 8.

The cap 9 is connected via fastening screws 10 to the housing flange 1, corresponding fastening bores 11 being provided in the housing flange 1.

A particularly simple shielding is obtained if one additionally arranges in the region of the circuit board 8 a conducting layer 13 connected electrically conductive via through-hole platings 12 to the housing flange 1.

According to the invention a highly precise centering is now provided between the annular flange 14 of the cap 9 and the inner periphery of the circuit board 8. The circuit board 8 has for this purpose on the radial inner periphery an interior bore 15 that fits against a corresponding vertical mating surface 17 on the inner periphery of the annular flange 14 of the cap 9. In this arrangement a centering is attained via the bevel 16 in such a way that during the assembly process a precise centric alignment takes place via the bevel 16 and a snug fit can thus be reliably attained in the region of the mating surface 17 between the annular flange 14 of the cap 9 and the interior bore 15 of the circuit board 8.

The rotor support 5 is rotatably supported in a recess 20 of the housing flange 1 and centered with the aid of the above-described knurled mating surface 21 on the outer periphery of the shaft 3.

Figure 9:
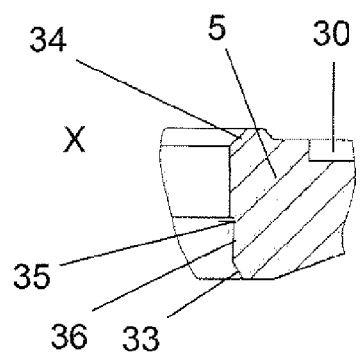
Figure 10:
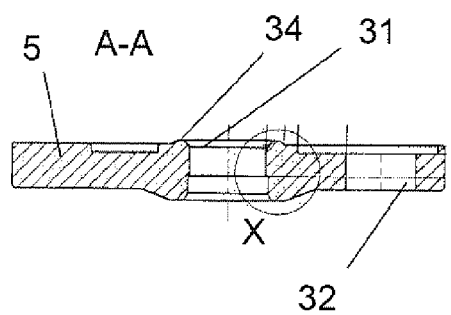
Figure 11:
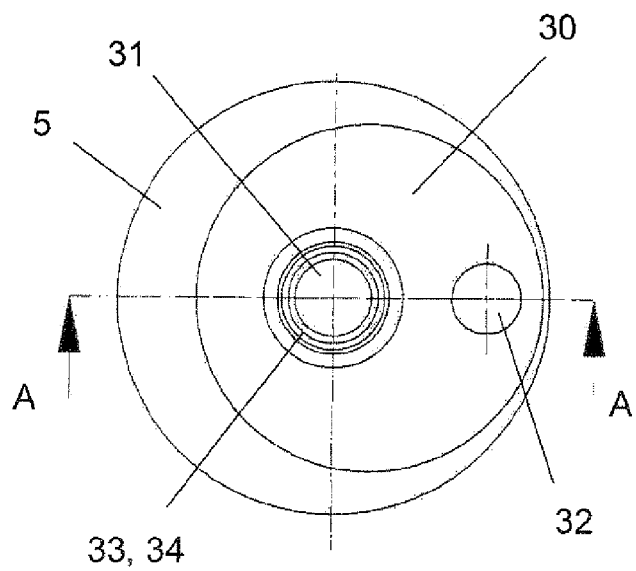
FIG. 11 shows a top view of the rotor support according to FIG. 10

An upper adhesive surface 34 is provided for this purpose according to FIGS. 9 to 11 in the region of the center bore 31 of the rotor support 5, said adhesive surface 34 being designed in the form of a beveled surface, such that in the region of this adhesive surface 34 an adhesive bead is formed in order to thus protect the rotor support 5 from falling off the shaft 3 upward in an axial direction.

FIG. 9 furthermore shows that a stop surface 35 adjoins the mating surface 36 that is situated opposite the knurled mating surface 21, such that an axial limit stop is provided when the rotor support 5 is placed on the outer periphery of the shaft 3 in an axial direction.

The outer periphery of the shaft 3 carries a dentition 22 in order to thus permit a form-fitting, rotationally integral connection to the rotor support 5.

The cap 9 carries on its upper side in the region of the inwardly oriented annular flange 14 an assembly opening 23. This allows the entire unit to be pressed onto and removed from a drive shaft. A threaded arbor passes through the assembly opening 23 for this purpose and engages into the threaded bore 24 of the hollow bore in the face end of the shaft 3 where it is fixed.

Figure 8:
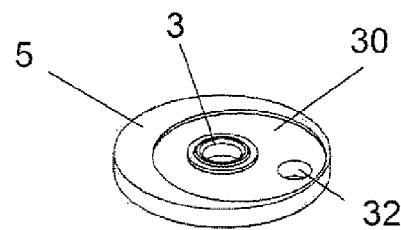

FIGS. 8, 10 and 11 furthermore show that a through-bore, a blind bore or a recess according to FIG. 10 is formed in the rotor support 5. This is intended to prevent an unbalance of the rotor support 5 during rotation because the eccentric rotor disc 6 is arranged on the rotor support 5 and would accordingly exert an unbalance if no such recess 32 were provided that serves a counterweight.

In order to be able to place the rotor support 5 onto the dentition 22 of the shaft 3 in a facilitated manner, the center bore of the rotor support 5 has, according to FIG. 9, a radially outward facing insertion bevel 33.

FIGS. 12 and 13 show the correspondence between the rotor disc 6 and the centric stator surface 37.

Figure 19:
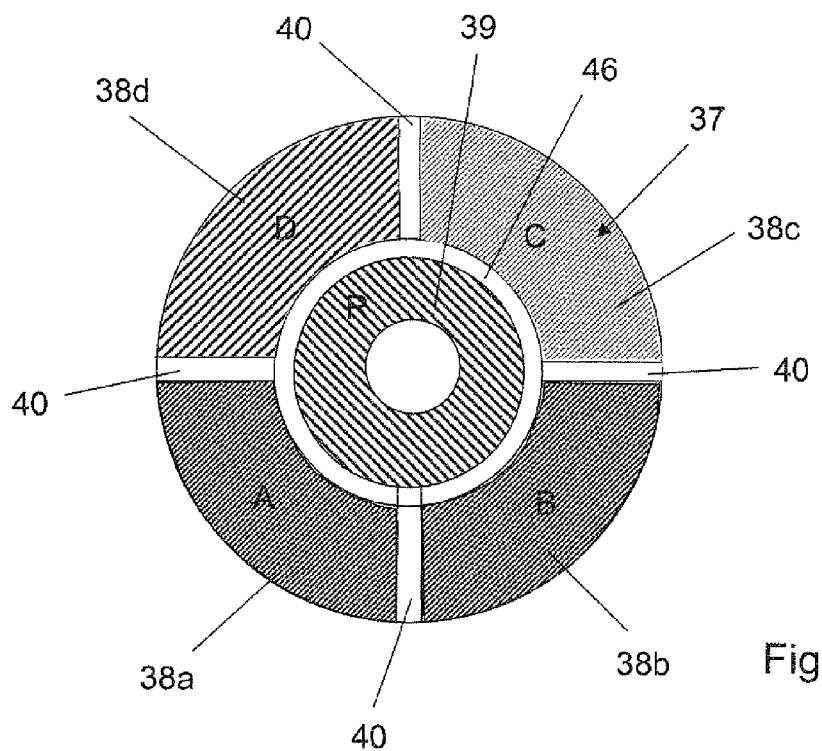
FIG. 19 shows the top view of the stator with four uniform quadrants

The stator surface 37, according to FIG. 19, has quadrants 38*a*, 38*b*, 38*c*, 38*d* that are electrically conductive but separated from one another by radially extending bridge bar isolators, such that altogether four conductive coatings are isolated from one another.

On the inner periphery these quadrants 38*a-d* are isolated from one another by means of a peripheral electrically isolating ring 46.

In the inner periphery of the isolating ring 46 an electrically conductive centric stator ring 39 is provided that is denoted with the letter R in FIG. 19. The individual quadrants 38 are denoted with the capital letters A, B, C, D.

FIGS. 12 and 13 show the covering of the stator depicted in FIG. 19 by an eccentric rotor disc 6 which, in turn, consists of an electrically conductive continuous coating. The eccentric rotor disc 6 has an inner rotor ring 41 designed in the form of a centric ring and connected as a conductive coating in an electrically conductive manner to the remaining eccentric regions of the rotor disc 6. The rotor ring 41 thus is a virtual rotor ring that is arranged as an imagined conducting surface in the region of the entire conducting surface of the eccentric rotor disc. It is important that this imagined centric rotor ring 41 is situated exactly opposite the centric stator ring 39 and forms, according to FIG. 14, a constant, unchangeable capacitance CR.

This is shown in the circuit analogy according to FIG. 14.

The eccentric regions of the rotor disc 6 situated opposite the centric quadrants 38 of the stator surface 37 then result, in the circuit analogy according to FIG. 14, in a variable capacitor CA', such that there results from these two capacitors CA' and CR a total capacitance CA.

The circuit analogy according to FIG. 14 results for each quadrant A, B, C and D. It is understood in this context that the tap 45 is provided at each quadrant, i.e. the tap 45*a* applies to quadrant A and the center stator ring 39.

An identical tap 45*a, b* serves for deriving the capacitance value from quadrant B and an additional tap serves for deriving the capacitance value from quadrant C, etc.

The rotor disc 6 thus is subdivided into two parts, namely an eccentric outer region 42 and a centric inner region incorporating the rotor ring 41.

From this one obtains a constant capacitor 43 that is shown in the circuit analogy according to FIG. 14.

Figure 15:
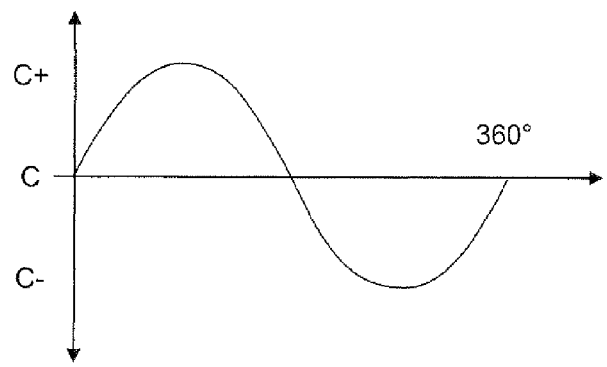
FIG. 15 shows the capacitance derived between the rotor and stator at a full rotation of the rotor about 360 degrees

FIG. 15 shows a capacitance plot from one quadrant during a rotation of the rotor relative to the stator over a full angle of rotation of 360 degrees.

Figures 16, 17, 18:
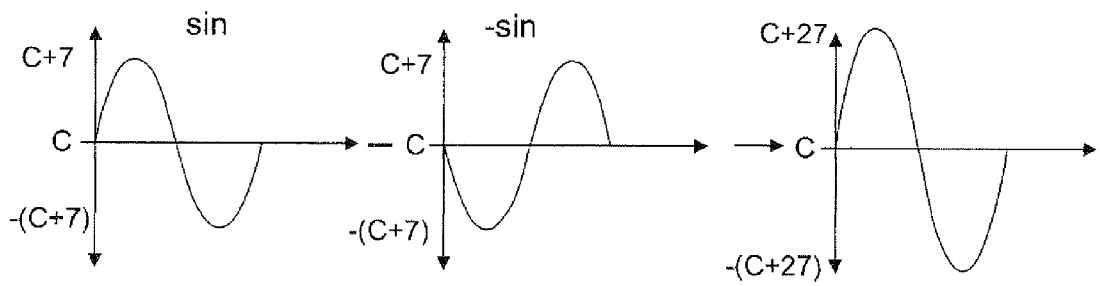
FIGS. 16-18 show the additional plots of the capacitance derived from FIG. 15, with FIGS. 16 and 17 showing the capacitance value derived from the individual quadrants of the rotor disc, which are combined to obtain a total capacitance value according to FIG. 18

The total plot is composed according to FIGS. 16 and 17. In FIG. 16 one can see the modulated capacitance plot over 360 degrees and FIG. 17 shows the modulated capacitance plot shifted by 180 degrees, with quadrants B and D, for example, being read out against each other in order to thus obtain the plots of FIGS. 16 and 17. The sum of these two values is obtained as the cumulative plot according to FIG. 18, with the capacitance values being doubled in the process. This results in a highly precise read-out because doubled capacitance values can be read out better than single capacitance values. The evaluation circuit consequently is simpler and more precise.

The mathematical summation of the two measured values from FIGS. 16 and 17 produces the cumulative plot according to FIG. 18.

FIG. 20 shows, as an illustrative embodiment, an adhesive ring 7 that is fixed adhesively in the recess 29 of the rotor support. It is apparent that the adhesive ring 7 has opposed adhesive surfaces 53a, 53b, thereby having the effect of a double-sided adhesive ring.

FIG. 21 shows an evaluation circuit of a capacitive sensor 50 according to the invention. In this arrangement the stator surface 37 is situated across from the eccentric rotor surface 42 and a plurality of tap lines 47, 48 are provided, the positive and negative sine being derived via one pair of tap lines 47 and the positive and negative cosine angle being derived via the other pair of tap lines 48. Both capacitor values that are tapped on the electrodes situated across from one another form the input for an evaluation circuit 49 consisting substantially of two modules, namely a capacitance measuring circuit 51 and a corresponding evaluation circuit 52 whereby digital values are output on the output line.

| Drawing Legend | |
|---|---|
| 1 | housing flange |
| 2 | ball bearing |
| 3 | shaft |
| 4 | clamping ring |
| 5 | rotor support |
| 6 | rotor disc (eccentric) |
| 7 | adhesive ring |
| 8 | circuit board (stator |
| 9 | flap [sic] |
| 10 | fastening screw |
| 11 | fastening bore |
| 12 | through-hole plating |
| 13 | conducting layer |
| 14 | annular flange (cap 9) |
| 15 | interior bore (8) |
| 16 | bevel |
| 17 | mating surface |
| 18 | electrical connection |
| 19 | air gap |
| 20 | recess |
| 21 | knurled mating surface |
| 22 | dentition |
| 23 | assembly opening |
| 24 | threaded bore |
| 25 | mating surface |
| 26 | vertical flange (9) |
| 27 | horizontal flange (9) |
| 28 | electronic circuit |

| Drawing Legend | |
|---|---|
| 29 | recess (18) |
| 30 | depression (for 6) |
| 31 | center bore (of 5) |
| 32 | recess for counterweight |
| 33 | insertion bevel |
| 34 | adhesive surface |
| 35 | stop surface |
| 36 | mating surface |
| 37 | stator surface |
| 38 | a, b, c, d quadrant (stator) |
| 39 | stator ring |
| 40 | bridge bar isolator |
| 41 | rotor ring (of 6) |
| 42 | eccentric outer region (of 6) |
| 43 | constant capacitor (41) |
| 44 | variable capacitor |
| 45 | tap a, b |
| 46 | isolating ring |
| 47 | tap line |
| 48 | tap line |
| 49 | measuring circuit |
| 50 | capacitive sensor |
| 51 | capacitance measuring circuit |
| 52 | evaluation circuit |
| 53 | adhesive surface a - top, b - bottom |
| 54 | output line |

What is claimed is:

1. A capacitive rotation sensor for detecting the position of an object moving relative to a stationary object, comprising a shaft (3) rotatably supported in a housing flange (1), said shaft (3) being connected integral in rotation therewith to a rotor (5, 6) to which, separated by an air gap (19) a stator (8) situated opposite thereto is assigned, wherein at least the rotor (5, 6), the stator (8) and an evaluation circuit (28) are enclosed by an electrically conductive cap, wherein a stator surface (37) is arranged on the underside of a circuit board (8) and the stator surface (37) has assigned thereto, situated opposite thereto and separated by the air gap (19), a non-rotation-symmetrical rotor disc (6) which, in turn, is fixed on a rotor support (5), said rotor support (5) being fastened highly precisely on the outer periphery of the shaft (3) so as to be integral in rotation therewith, wherein in order to attain a highly precise arrangement that is protected against unbalance, provision is made that the eccentric rotor disc (5, 6) consists of a copper surface that is arranged on an insulating rotor support (5).

2. A rotation sensor as set forth in claim 1, wherein the circuit board (8) carries on its underside the electrically conductive stator surface (37) that consists of a copper conductor path which is coated with an insulating lacquer.

3. A rotation sensor as set forth in claim 1, wherein the circuit board (8) carries the electronic evaluation circuit and the circuit for error correction.

4. A rotation sensor as set forth in claim 1, wherein the shaft (3) is rotatably supported in the housing flange (1) via the ball bearings (2) and that the shaft (3) extends with a lower elongated portion out from the housing of the capacitive rotation sensor and is secured with the aid of a clamping ring (4) against falling out.

5. A rotation sensor as set forth in claim 1, wherein the upper shortened portion of the shaft (3) is arranged in the housing flange (1) and covered by the cap (9).

6. A rotation sensor as set forth in claim 1, wherein the stator surface (37) has quadrants (38a, 38b, 38c, 38d) that are electrically conductive but separated from one another by radially extending bridge bar isolators, said quadrants being designed as conductive coatings and mutually isolated from one another.

7. A rotation sensor as set forth in claim 6, wherein the quadrants (38*a-d*) are separated from one another at the inner periphery by a peripheral electrically isolating ring (46) and that on the inner periphery of the isolating ring (46) an electrically conductive centric stator ring (39) is provided.

8. A rotation sensor as set forth in claim 1, wherein the eccentric rotor disc (6) has an inner centric rotor ring (41) that is connected as a conductive coating in an electrically conductive manner to the remaining eccentric regions of the rotor disc (6).

9. A rotation sensor as set forth in claim 1, wherein the rotor disc (6) is subdivided into an eccentric outer region (42) and a centric inner region incorporating the rotor ring (41).

10. A capacitive rotation sensor for detecting the position of an object moving relative to a stationary object, comprising a shaft (3) rotatably supported in a housing flange (1), said shaft (3) being connected integral in rotation therewith to a rotor (5, 6) to which, separated by an air gap (19) a stator (8) situated opposite thereto is assigned, wherein at least the rotor (5, 6), the stator (8) and an evaluation circuit (28) are enclosed by an electrically conductive cap, wherein a stator surface (37) is arranged on the underside of a circuit board (8) and the stator surface (37) has assigned thereto, situated opposite thereto and separated by the air gap (19), a non-rotation-symmetrical rotor disc (6) which, in turn, is fixed on a rotor support (5), said rotor support (5) being fastened highly precisely on the outer periphery of the shaft (3) so as to be integral in rotation therewith, wherein the rotor support (5) is designed as a simple, cost-effective plastic part that is fitted highly precisely and in a form-fitting manner onto the outer periphery of the shaft (3).

11. A capacitive rotation sensor for detecting the position of an object moving relative to a stationary object, comprising: a shaft (3) rotatably supported in a housing flange (1), said shaft (3) being connected integral in rotation therewith to a rotor (5, 6) to which, separated by an air gap (19), a stator (8) situated opposite thereto is assigned, wherein at least the rotor (5, 6), the stator (8) and an evaluation circuit (28) are enclosed by an electrically conductive cap, a stator surface (37) is arranged on the underside of a circuit board (8) and the stator surface (37) has assigned thereto, situated opposite thereto and separated by the air gap (19), a non-rotation-symmetrical rotor disc (6) which, in turn, is fixed on a rotor support (5), said rotor support (5) being fastened highly precisely on the outer periphery of the shaft (3) so as to be integral in rotation therewith, and a recess (30) that is open on one side and disposed on the rotor support (5), in which the eccentric rotor disc (6) is inserted, wherein the rotor disc (6) is fixed adhesively in the recess (30).

12. A rotation sensor as set forth in claim 11, wherein the rotor disc (6) is fixed in the recess by means of a double-sided adhesive ring (7).

13. A capacitive rotation sensor for detecting the position of an object moving relative to a stationary object, comprising a shaft (3) rotatably supported in a housing flange (1), said shaft (3) being connected integral in rotation therewith to a rotor (5, 6) to which, separated by an air gap (19), a stator (8) situated opposite thereto is assigned, wherein at least the rotor (5, 6), the stator (8) and an evaluation circuit (28) are enclosed by an electrically conductive cap, a stator surface (37) is arranged on the underside of a circuit board (8) and the stator surface (37) has assigned thereto, situated opposite thereto and separated by the air gap (19), a non-rotation-symmetrical rotor disc (6) which, in turn, is fixed on a rotor support (5), said rotor support (5) being fastened highly precisely on the outer periphery of the shaft (3) so as to be integral in rotation therewith, wherein the rotor support (5) is fixed unstressed on the outer periphery of the shaft (3) in a form-fitting manner and integral in rotation therewith.

14. A capacitive rotation sensor for detecting the position of an object moving relative to a stationary object, comprising a shaft (3) rotatably supported in a housing flange (1), said shaft (3) being connected integral in rotation therewith to a rotor (5, 6) to which, separated by an air gap (19) a stator (8) situated opposite thereto is assigned, wherein at least the rotor (5, 6), the stator (8) and an evaluation circuit (28) are enclosed by an electrically conductive cap, wherein a stator surface (37) is arranged on the underside of a circuit board (8) and the stator surface (37) has assigned thereto, situated opposite thereto and separated by the air gap (19), a non-rotation-symmetrical rotor disc (6) which, in turn, is fixed on a rotor support (5), said rotor support (5) being fastened highly precisely on the outer periphery of the shaft (3) so as to be integral in rotation therewith, and a dentition (22) provided on the outer periphery of the shaft (3), and the rotor support (5) has on its inner periphery a corresponding dentition, such that a rotationally integral and form-fitting connection between the rotor support and the outer periphery of the shaft is provided.

15. A capacitive rotation sensor for detecting the position of an object moving relative to a stationary object, comprising a shaft (3) rotatably supported in a housing flange (1), said shaft (3) being connected integral in rotation therewith to a rotor (5, 6) to which, separated by an air gap (19) a stator (8) situated opposite thereto is assigned, wherein at least the rotor (5, 6), the stator (8) and an evaluation circuit (28) are enclosed by an electrically conductive cap, a stator surface (37) is arranged on the underside of a circuit board (8) and the stator surface (37) has assigned thereto, situated opposite thereto and separated by the air gap (19), a non-rotation-symmetrical rotor disc (6) which, in turn, is fixed on a rotor support (5), said rotor support (5) being fastened highly precisely on the outer periphery of the shaft (3) so as to be integral in rotation therewith, wherein the rotor support (5) consists of a plastic material and is injection-molded directly onto the outer periphery of the metal shaft (3).

16. A capacitive rotation sensor for detecting the position of an object moving relative to a stationary object, comprising a shaft (3) rotatably supported in a housing flange (1), said shaft (3) being connected integral in rotation therewith to a rotor (5, 6) to which, separated by an air gap (19) a stator (8) situated opposite thereto is assigned, wherein at least the rotor (5, 6), the stator (8) and an evaluation circuit (28) are enclosed by an electrically conductive cap, wherein a stator surface (37) is arranged on the underside of a circuit board (8) and the stator surface (37) has assigned thereto, situated opposite thereto and separated by the air gap (19), a non-rotation-symmetrical rotor disc (6) which, in turn, is fixed on a rotor support (5), said rotor support (5) being fastened highly precisely on the outer periphery of the shaft (3) so as to be integral in rotation therewith, wherein the outer periphery of the housing flange (1) serves as a centering surface for the inner periphery of the cap (9) placed thereupon and that the cap (9) transfers this centric dimension to an axially inwardly situated annular flange (14) at the lower front face of which a bevel (16) is provided, against which the inner periphery of the circuit board (8) fits highly precisely with the aid of a mating surface (17) in order to thus be highly precisely centered in the housing.

17. A rotation sensor as set forth in claim 16, wherein a highly precise centering between the annular flange (14) of the cap (9) and the inner periphery of the circuit board (8) is provided and that the circuit board (8) has on the inner periphery an interior bore (15) that fits against a vertical mating surface (17) on the inner periphery of the annular flange (14) of the cap (9).

18. A rotation sensor as set forth in claim 17, wherein the circuit board (8) has on the radial inner periphery an interior bore (15) that fits against a corresponding vertical mating surface (17) on the inner periphery of the annular flange (14) of the cap (9).

19. A capacitive rotation sensor for detecting the position of an object moving relative to a stationary object, comprising a shaft (3) rotatably supported in a housing flange (1), said shaft (3) being connected integral in rotation therewith to a rotor (5, 6) to which, separated by an air gap (19), a stator (8) situated opposite thereto is assigned, wherein at least the rotor (5, 6), the stator (8) and an evaluation circuit (28) are enclosed by an electrically conductive cap, a stator surface (37) is arranged on the underside of a circuit board (8) and the stator surface (37) has assigned thereto, situated opposite thereto and separated by the air gap (19), a non-rotation-symmetrical rotor disc (6) which, in turn, is fixed on a rotor support (5), said rotor support (5) being fastened highly precisely on the outer periphery of the shaft (3) so as to be integral in rotation therewith, wherein the cap (9) comprises an outer vertical flange (26) that fits uniformly as an annular flange against the outer periphery of the housing flange (1) in the region of a mating surface (25) and this fit is transferred via the vertical flange (26) to the horizontal flange (27) of the cap (9) and from there to an inner annular flange (14) of the cap (9) that centers the circuit board (8).

20. A capacitive rotation sensor for detecting the position of an object moving relative to a stationary object, comprising a shaft (3) rotatably supported in a housing flange (1), said shaft (3) being connected integral in rotation therewith to a rotor (5, 6) to which, separated by an air gap (19), a stator (8) situated opposite thereto is assigned, wherein at least the rotor (5, 6), the stator (8) and an evaluation circuit (28) are enclosed by an electrically conductive cap, a stator surface (37) is arranged on the underside of a circuit board (8) and the stator surface (37) has assigned thereto, situated opposite thereto and separated by the air gap (19), a non-rotation-symmetrical rotor disc (6) which, in turn, is fixed on a rotor support (5), said rotor support (5) being fastened highly precisely on the outer periphery of the shaft (3) so as to be integral in rotation therewith, wherein the rotor support (5) is rotatably supported in a recess (20) of the housing flange (1) and centered with the aid of a knurled mating surface (21) on the outer periphery of the shaft (3).

21. A capacitive rotation sensor for detecting the position of an object moving relative to a stationary object, comprising a shaft (3) rotatably supported in a housing flange (1), said shaft (3) being connected integral in rotation therewith to a rotor (5, 6) to which, separated by an air gap (19), a stator (8) situated opposite thereto is assigned, wherein at least the rotor (5, 6), the stator (8) and an evaluation circuit (28) are enclosed by an electrically conductive cap, a stator surface (37) is arranged on the underside of a circuit board (8) and the stator surface (37) has assigned thereto, situated opposite thereto and separated by the air gap (19), a non-rotation-symmetrical rotor disc (6) which, in turn, is fixed on a rotor support (5), said rotor support (5) being fastened highly precisely on the outer periphery of the shaft (3) so as to be integral in rotation therewith, wherein, in the region of the center bore (31) of the rotor support (5) an upper adhesive surface (34) is provided designed in the form of a beveled surface, in the region of which an adhesive bead is provided in order to secure the rotor support (5) against falling off the shaft (3) upward in an axial direction.

22. A capacitive rotation sensor for detecting the position of an object moving relative to a stationary object, comprising a shaft (3) rotatably supported in a housing flange (1), said shaft (3) being connected integral in rotation therewith to a rotor (5, 6) to which, separated by an air gap (19), a stator (8) situated opposite thereto is assigned, wherein at least the rotor (5, 6), the stator (8) and an evaluation circuit (28) are enclosed by an electrically conductive cap, a stator surface (37) is arranged on the underside of a circuit board (8) and the stator surface (37) has assigned thereto, situated opposite thereto and separated by the air gap (19), a non-rotation-symmetrical rotor disc (6) which, in turn, is fixed on a rotor support (5), said rotor support (5) being fastened highly precisely on the outer periphery of the shaft (3) so as to be integral in rotation therewith, wherein a recess (32) is arranged eccentrically in the outer region of the rotor support (5) as a counterweight.

* * * * *